(12) United States Patent
Miya et al.

(10) Patent No.: US 7,662,727 B2
(45) Date of Patent: Feb. 16, 2010

(54) METHOD FOR MANUFACTURING SEMICONDUCTOR DEVICE BACKGROUND

(75) Inventors: Hironobu Miya, Toyama (JP); Norikazu Mizuno, Toyama (JP); Masanori Sakai, Takaoka (JP); Shinya Sasaki, Toyama (JP); Hirohisa Yamazaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 118 days.

(21) Appl. No.: 11/979,707

(22) Filed: Nov. 7, 2007

(65) Prior Publication Data
US 2008/0132084 A1 Jun. 5, 2008

(30) Foreign Application Priority Data
Nov. 10, 2006 (JP) .............................. 2006-305007

(51) Int. Cl.
*H01L 21/31* (2006.01)
*H01L 21/469* (2006.01)

(52) U.S. Cl. ...................... 438/774; 428/765; 428/780; 257/E21.224

(58) Field of Classification Search ................ 438/765, 438/774, 780; 257/E21.224
See application file for complete search history.

(56) References Cited

U.S. PATENT DOCUMENTS 5,578,130 A * 11/1996 Hayashi et al. .......... 118/723 E
6,593,211 B2 * 7/2003 Sato ............................ 438/455
7,135,207 B2 11/2006 Min et al.
2007/0148528 A1 * 6/2007 Sakai ............................ 429/38
2009/0042400 A1 * 2/2009 Pagliaro, Jr. ................. 438/745

OTHER PUBLICATIONS

R. L. Puurunen, "Analysis of hydroxyl group controlled atomic layer deposition of hafnium dioxide from hafnium tetrachloride and water," *Journal of Applied Physics*, vol. 95, No. 9, May 2004, pp. 4777-4786.
M. A. Alam et al., "Mathematical description of atomic layer deposition and its application to the nucleation and growth of $HfO_2$ Gate dielectric layers," *Journal of Applied Physics*, vol. 94, No. 5, Sep. 2003, pp. 3403-3413.

* cited by examiner

*Primary Examiner*—Alexander G Ghyka
*Assistant Examiner*—Seahvosh J Nikmanesh
(74) *Attorney, Agent, or Firm*—Oliff & Berridge, PLC

(57) ABSTRACT

To improve a step coverage and a loading effect, without inviting a deterioration of throughput and an increase of cost, in a method for forming a thin film by alternately flowing a raw material and alcohol to a processing chamber. The method includes: loading a silicon wafer having a surface terminated by H into a processing chamber; supplying alcohol to supply the alcohol into the processing chamber as a first gas; first purging to discharge the first gas from an inside of the processing chamber; supplying a raw material to supply a source gas into the processing chamber as a second gas; second purging to discharge the second gas from the inside of the processing chamber; generating a desired thin film on the silicon wafer by setting as one cycle at least the aforementioned supplying alcohol, first purging, supplying the raw material, and second purging, and by repeating this cycle a prescribed number of times; and unloading the silicon wafer, with said desired thin film generated thereon, from the inside of the processing chamber.

7 Claims, 10 Drawing Sheets

WHEN FIRSTLY FLOWIG ALCOHOL

WHEN FIRSTLY FLOWING RAW MATERIAL (HfCl₄)

First half-reaction

Second half-reaction

PRIOR ART

PRIOR ART

METHOD FOR MANUFACTURING SEMICONDUCTOR DEVICE BACKGROUND

BACKGROUND

1. Technical Field

The present invention relates to a method for manufacturing a semiconductor device, and particularly relates to the method for manufacturing the semiconductor device that can be suitably used in the step of forming an oxide film on a semiconductor wafer by an ALD (Atomic Layer Deposition) method.

2. Background Art

In recent years, with an increase of high-density and multilayer interconnection of a semiconductor DRAM device, film formation at a low temperature is required, and further a capacitor material having excellent planarity of a surface, recess filling property, and step coverage property, and high dielectricity (k) is required. Materials such as $HfO_2$ (k=30), $ZrO_2$ (k=25) are used as the capacitor material having higher dielectricity than that of a conventional $Si_3N_4$ (k=7).

A film formation method of $HfO_2$ includes a sputtering method, a MOCVD (Metal organic CVD) method, and an ALD method, and among these methods, the ALD method capable of performing the film formation at a low temperature and having high step coverage property has been focused in recent years, and has been developed energetically.

The ALD (Atomic Layer Deposition) method, which is one of the CVD (Chemical Vapor Deposition) method, is a technique of supplying reactive gas, being at least two kinds of raw materials used in film formation, onto an Si wafer alternately one by one, making this reactive gas adsorbed on a silicon wafer by one atomic unit, and performing film formation by using a surface reaction.

As a hafnium raw material used in the ALD film formation method, an organic material of Hf such as Hf $(O\text{-}tBu)_4$ (Hafnium tertiary butoxide:Hf $[OC(CH_3)_3]_4$), Hf (MMP) (Tetrakis 1-methoxy 2-methyl 2-propoxy hafnium:Hf $[OC(CH_3)_2CH_2OCH_3]_4$), $Hf(Net_2)_4$ (Tetrakis diethyl amino hafnium:Hf $[N(C_2H_5)_2]_4$), $Hf(NMeEt)_4$ (Tetrakis ethylmethyl amino hafnium:Hf $[N(CH_3)(C_2H_5)]_4$), and a chloride material such as $HfCl_4$ are used. Note that $C_2H_5$ is abbreviated to $H_5$, and $CH_3$ is abbreviated to Me.

In addition, $H_2O$ and ozone ($O_3$), or oxygen excited by plasma is used as an oxide material.

However, when a thin film such as a $HfO_2$ film is formed by flowing the aforementioned materials alternately into a processing chamber, a film thickness in a wafer central part is decreased by using a pattern wafer having a trench (groove) structure, thus deteriorating a step coverage or deteriorating the step coverage of the $HfO_2$ film by the number of pattern wafers in 1 batch (called a loading effect).

In order to improve such step coverage and loading effect, a supply amount of the hafnium raw material is increased or supplying time is increased, thus improving the step coverage and the loading effect. However, an increase of the film forming time is invited to deteriorate throughput, and a cost involved in the raw material is increased by the increase of consumption of the raw material, to invite a deterioration of COO (Cost of ownership: manufacturing cost per one wafer).

SUMMARY OF THE INVENTION

In order to solve the above-described problems, the present invention is provided, and an object of the present invention is to provide a method for manufacturing a semiconductor device for forming a thin film by flowing a raw material and alcohol alternately into a processing chamber, capable of improving step coverage property and loading effect, without inviting a deterioration of throughput or increase of cost.

According to a first aspect of the present invention, there is provided a method for manufacturing a semiconductor device, including:

loading a silicon wafer having an H-terminated surface into a processing chamber;

supplying alcohol into the processing chamber as a first gas;

first purging to discharge the first gas from the processing chamber;

supplying source gas into the processing chamber as second gas;

second purging to purge the second gas from the processing chamber; and generating a desired thin film on the silicon wafer, by repeating a plurality of times a cycle, with at least the aforementioned supplying alcohol, first purging, supplying the raw material, and second purging set as one cycle; and unloading the silicon wafer formed with the desired thin film from the processing chamber.

According to the present invention, the step coverage and the loading effect can be improved, without inviting the deterioration of throughput and increase of cost.

BRIEF DESCRIPTION OF THE DRAWINGS

FIG. 5 is a view showing an ALD film formation mechanism in an $HfCl_4$ system and an $H_2O$ system of a conventional example.

FIG. 11 is a block diagram of a processing furnace of the $HfO_2$ film forming apparatus by ALD according to an embodiment of the present invention.

BEST MODE FOR CARRYING OUT THE INVENTION

Examples of the present invention will be explained hereunder. However, before the explanation is given, in order to clarify the present invention, the explanation will be given to a film forming speed of HfO$_2$, research on a Si surface terminated by hydrogen, and an ALD mechanism to form an HfO$_2$ film on the surface of a Si substrate terminated by OH-group.

<A Film Forming Speed of HfO$_2$>

First, adsorption of a raw material on a substrate during forming the HfO$_2$ film is considered.

M. A. Alam and M. L. Green expresses the film forming speed of HfO$_2$ by the following formula in a reaction system of HfCl$_4$ and H$_2$O (Journal of Applied Physics, Vol. 94, 2003).

$$dN_{HfO2}/dc = K_{COV}N_{OH} \quad (1)$$

$$dN_{OH}/dC = K_2(N_O - N_{SIOH}) + (\alpha_{COV} - 1)K_{COV}N_{OH} \quad (2)$$

Here, $N_{HfO2}$ indicates a total amount of the HfO$_2$ film deposited per unit area after ALD reaction, C indicates the number of cycles of C, $K_{COV}$ indicates the number of hydroxyl group (—OH) that reacts with HfCl$_4$, $N_{OH}$ indicates a surface density of the hydroxyl group, and K$_2$ indicates a speed constant of the hydroxyl group newly bonding to Si. Note that $N_O$ indicates the number of sites on which the raw material can be easily adsorbed, NSiOH indicates the number of sites of Si—OH, and $\alpha_{cov}$ indicates a coverage ratio of $N_{OH}$ in the formula (2).

Thus, it appears that the film forming speed of HfO$_2$ is increased, as the number of OH-group capable of reacting is increased and the surface density of the OH-group is higher.

<The ALD mechanism of forming the HfO$_2$ film on the surface of the Si substrate terminated by OH-group>

Figure 5A:
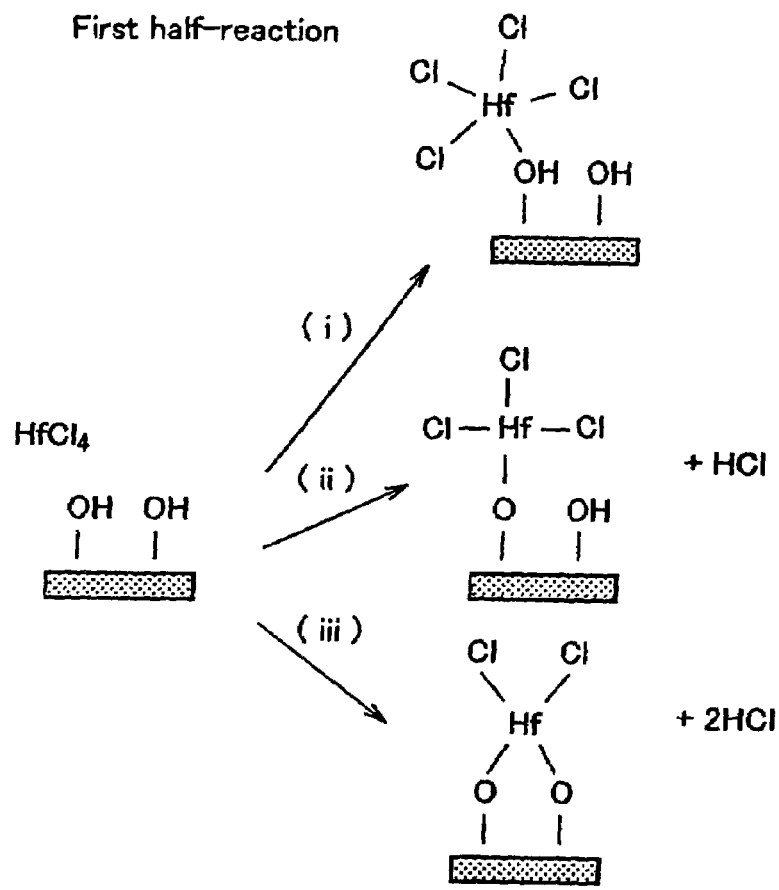
FIG. 5A shows a first-half-reaction and FIG. 5B shows a second-half reaction.
Figure 5B:
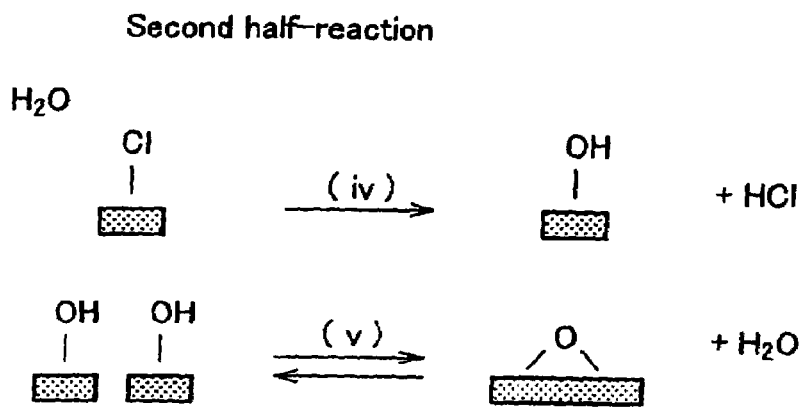

In addition, as shown in FIG. 5, R. L. Puurunen (Journal of Applied Physics, vol. 95. 2004, 4777-4786) proposes a model in which Cl group of the HfCl$_4$ reacts with the OH-group on the substrate by a first half reaction, thereby making HfClx adsorbed thereon, and Cl of HfClx is substituted with OH-group by a second half reaction.

Namely, a reaction mechanism caused by the first reaction (FIG. 5A) in HfCl$_4$/H$_2$OALD process and the next half reaction (FIG. 5B) is as follows.

(i) Composition of HfCl$_4$ to the surface of the OH-group
(ii) Substituting solution of HfCl$_4$ on the surface of an OH-group 1
(iii) Substituting solution of HfCl$_4$ on the surface of an OH-group 2.
(iv) Substituting solution of H$_2$O on the surface of the Cl group.
(v) Condensing of two adjacent OH-groups to a place where water is released.

Thus, it has been so considered that adsorption reaction is progressed by an existence of the hydroxyl group (OH-group) on the substrate, and when the surface of the Si substrate is terminated by hydrogen (H), it has been so considered that the raw material is hardly adsorbed on this surface, compared to the substrate surface terminated by OH-group.

<Research on the Si Surface Terminated by Hydrogen>

Incidentally, the research of the surface terminated by hydrogen is energetically progressed in a period from the latter half of 1989 to 1990. It is clarified that the Si surface subjected to etching by HF of 1% is a chemically stable surface, with a major part of a dangling bond being terminated by hydrogen. For example, in oxidizing processing, SiO$_2$ component is recognized on the surface left in atmospheric air after cleaning, while the Si surface terminated by hydrogen is hardly oxidized. This means that adsorption of the raw material is not promptly performed on the chemically stable surface, from the viewpoint of adsorbability of the raw material. Accordingly, creation of the surface, on which the raw material can be easily adsorbed, is desired.

<ALD Film Forming Mechanism for Forming the Substrate Surface into OH and Forming the HfO$_2$ Film Thereon>

Here, the explanation will be given to an ALD film forming mechanism in which the substrate surface terminated by H is formed into OH, to form the HfO$_2$ film thereon, based on two comparative examples wherein H$_2$O and O$_3$ are used as an oxidizing material, respectively.

(1. TEMAH/H$_2$O System)

Figure 6:
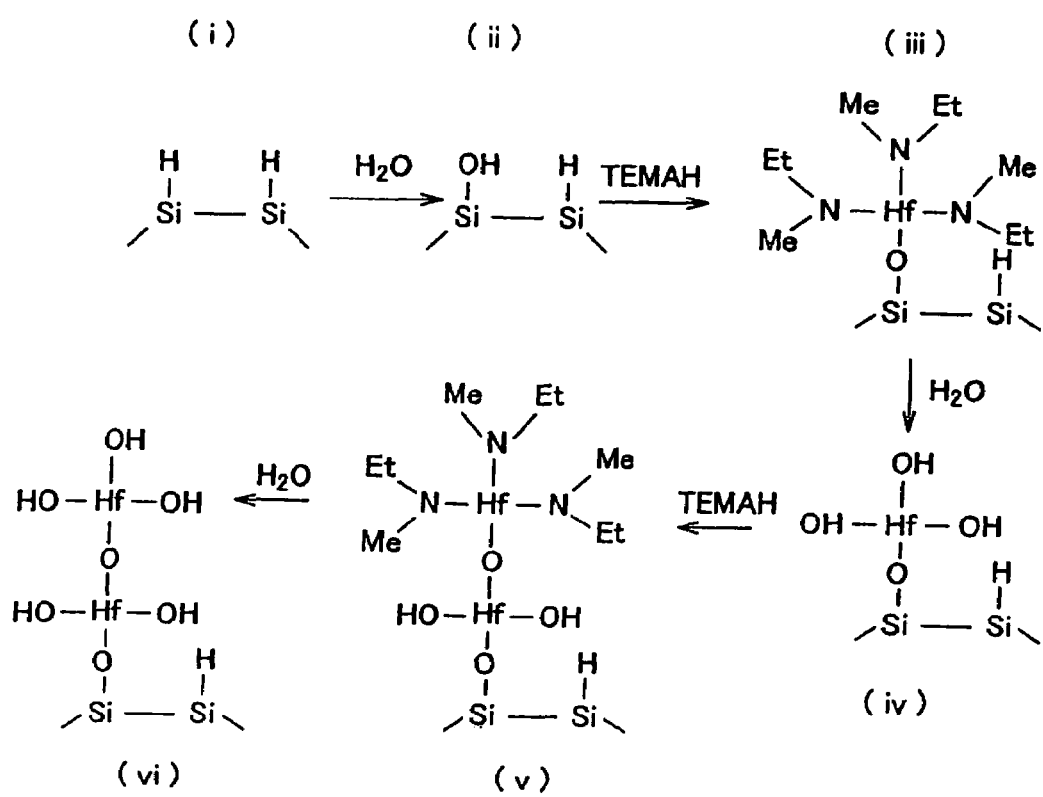
FIG. 6 shows an ALD film formation mechanism in a TEMAH system and the $H_2O$ system of a conventional example.

FIG. 6 shows a film formation model when TEMAH(Hf (NMeEt)$_4$), being an organic Hf raw material, and H$_2$O as an oxidizing material, and each step is as follows.

(i) The surface of the substrate is terminated by H. (ii) When H$_2$O is supplied to such a substrate surface, H$_2$O molecule is dissociated to occupy two dangling bonds by one molecule. One of them is Si—OH, and the other one is Si—H. (iii) In the TEMAH supplying step of a first cycle of ALD, TEAMH(Hf(NMeEt)$_4$) is adsorbed on the Si—OH site where the raw material is more easily adsorbed than a chemically stable Si—H site.

(iv) In the H$_2$O supplying step of the first cycle, N(Me)(Et) of the adsorbed TEMAH molecule N(Me)(Et) is desorped and a reaction site of the raw material is substituted with the OH-group. Thus, the HfO$_2$ film of a first atom layer is formed.

(v) In the TEMAH supplying step of a second cycle, the TEAMH is adsorbed on the Hf—OH site. (vi) When H$_2$O of the second cycle is supplied, N(Me)(Et) of the adsorbed TEMAH molecule is desorped and the reaction site of the raw material is substituted with the OH-group. Thus, the HfO$_2$ film of a second atom layer is formed.

(2. TEMAH/O$_3$ System)

Figure 7:
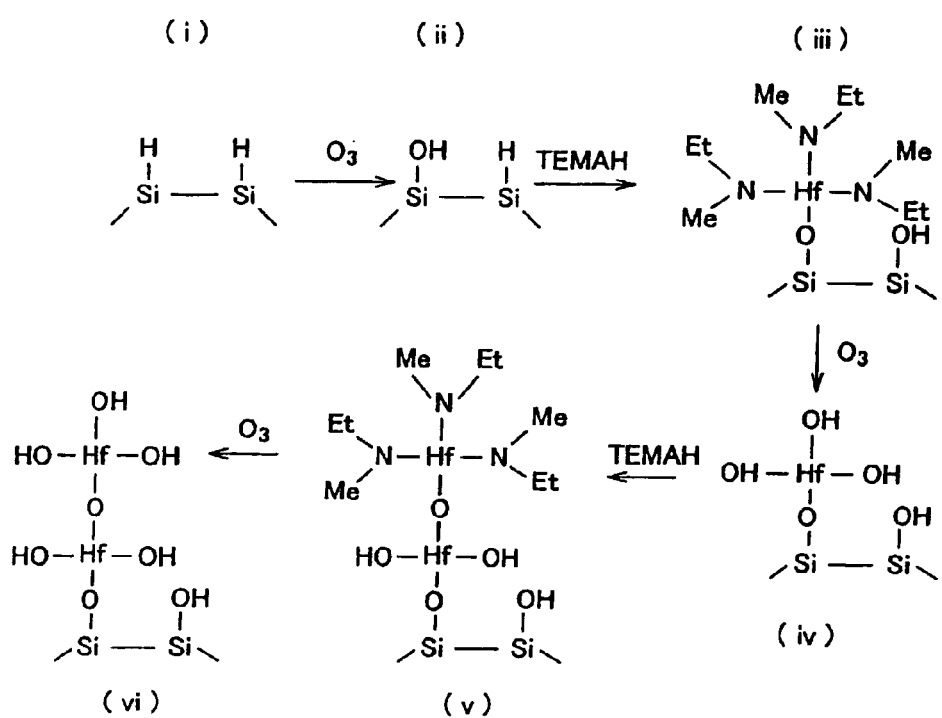
FIG. 7 shows the ALD film formation mechanism in the TEMAH system and $O_3$ system of a conventional example.

Meanwhile, the film formation model when using TEMAH and O$_3$ is shown in FIG. 7.

The substrate surface (i) terminated by H is substituted by the OH-group by ozone radical (active radical) O* generated from an ozone molecule (ii). By supplying the TEMAH, TEAMH(Hf(NMeEt)$_4$) is adsorbed on the Si—OH site. (iii). By supplying O*, the reaction site of the raw material is substituted with the OH-group (iv), and by the next supplying of the TEMAH, TEAMH is adsorbed on the Hf—OH site (v), and by the next supplying of O*, the reaction site of the raw material is substituted with the OH-group (vi).

(3. Comparison when H$_2$O and O$_3$ are Used)

Basically, although the ALD process of H$_2$O and O$_3$ can be considered to be same, they are different from each other in the next points.

In the process of O$_3$, the step of generating the OH-group by the reaction of activated O* and N(Me)(Et) is required, while the OH-group is dissociated from an H$_2$O molecule in the process of H$_2$O. Therefore, in the OH formation on the surface of a silicon wafer (Si wafer), reaction is more easily progressed in the oxidization by H$_2$O than in the oxidization by O$_3$.

In addition, the N(Me)(Et) is separated by the activated O*, thus increasing a capture of carbon (c) during film formation. Meanwhile, H$_2$O removes the N(Me)(Et), thus reducing the capture of carbon (C) during film formation. However, it is pointed out that in an insulating film formed by using an organic raw material and H$_2$O, as a film quality, H$_2$O is remained in the film and therefore leak current is increased, compared to a film using O$_3$.

As described above, in order to allow the reaction of a thin film raw material and an oxide material to easily progress, preferably, the surface of the Si wafer is oxidized so as to be turned into OH. However, the oxidization by $H_2O$ and oxidization by $O_3$ have both merits and demerits. Therefore, in order to generate a desired thin film on the Si wafer, the oxide material other than the aforementioned one is required.

<Knowledge Obtained by the Present Invention>

Inventors of the present invention so considers from the aforementioned research result and an ALD film formation mechanism, that the organic raw material such as a TEMAH is hardly adsorbed on the surface of the Si wafer with no polarity terminated by H, but easily adsorbed on the surface of the Si wafer terminated by OH, because this surface has a polarity.

Namely, the inventors of the present invention obtains a knowledge that in order to improve facilitation of adsorption of the raw material, a large polarity of atoms on the surface is important.

By this knowledge, the inventors of the present invention achieves the method of the present invention wherein an oxidization step is executed by not using $H_2O$ or $O_3$ for the oxide material, but using a material having a large polarity, namely, by using alcohol.

ASPECT OF THE INVENTION

According to a first aspect of the present invention, there is provided a method for manufacturing a semiconductor device including:

loading into a processing chamber an Si wafer having a surface terminated by H;

supplying alcohol into the processing chamber as a first gas;

first purging to discharge the first gas from the processing chamber;

supplying a raw material to supply a source gas into the processing chamber as a second gas;

second purging to discharge the second gas from the processing chamber;

generating a desired thin film on the Si wafer, with at least the aforementioned supplying alcohol, first purging, supplying the raw material, and second purging set as one cycle, and by repeating this cycle a prescribed number of times; and unloading from the processing chamber the Si wafer on which the aforementioned desired thin film is generated.

In the method of forming the thin film by alternately supplying the oxide material and the source gas into the processing chamber, the alcohol is used as the oxide material, thus making it possible to easily progress the reaction with the thin film raw material, without increasing a supply amount of the thin film raw material. As a result, a step coverage and a loading effect can be improved, without inviting a deterioration of throughput or increase of cost.

Note that although a plurality of Si wafers are preferable for being loaded into the processing chamber, to improve the throughput, at least one Si wafer may be loaded into the processing chamber. The raw material containing a metal compound is given as the raw material of the source gas. An organic compound containing aluminum atom, titanium atom, zirconium atom, hafnium atom, tantalum atom, ruthenium atom, iridium atom, silicon atom, and a chloride of these atoms are given as the metal compound. Also, the alcohol is the raw material containing oxygen atom. When the raw material is selected to be the raw material containing the metal compound, a desired thin film generated on the Si wafer is a metal oxide film. One kind out of $Al_2O_3$, $TiO_2$, $ZrO_2$, $HfO_2$, $Ta_2O_5$, $RuO_2$, $IrO_2$, $SiO_2$ is selected to be the metal oxide thin film.

In one aspect of the present invention, preferably, when the processing gas is supplied into the processing chamber, the alcohol, being the first gas, is supplied into the processing chamber prior to tetrakis-methyl-ethyl-amino-hafnium (TEMAH), being the second gas. When the alcohol is supplied into the processing chamber prior to the TEMAH at the time of particularly supplying the processing gas into the processing chamber, when the thin film is formed by alternately flowing the alcohol and the source gas, the reaction with the thin film raw material can be further easily progressed. In addition, when the TEMAH is supplied into the processing chamber prior to the alcohol, a problem such as easily defusing raw materials into the Si wafer is liable to occur. However, according to an aspect of the present invention, the alcohol is supplied into the processing chamber prior to the TEMAH, thus making it possible to solve such a problem.

Further, preferably, the alcohol, being the first gas supplied into the processing chamber, substitutes the H-group with the OH-group on the Si wafer surface terminated by H as described above in the first supply, and substitutes a reaction site of the raw material with the OH-group in the second supply and thereafter.

When the alcohol substitutes the H-group with the OH-group on the Si wafer surface terminated by H in the first supply, the reaction with the thin film raw material can be easily progressed. In addition, in the second supply and thereafter, when the alcohol substitutes the reaction site of the raw material with the OH-group, the reaction with the thin film raw material can be further easily progressed. Accordingly, the step coverage and the loading effect can be improved, without further inviting the deterioration of the throughput or increase of the cost.

<TEMAH/ALD Film Formation Mechanism of Ethanol System>

Here, a method of executing an oxidization process by not using $H_2O$ or $O_3$ but using a material having a larger polarity as an oxidization material will be explained with reference to FIG. 8.

Figure 8:
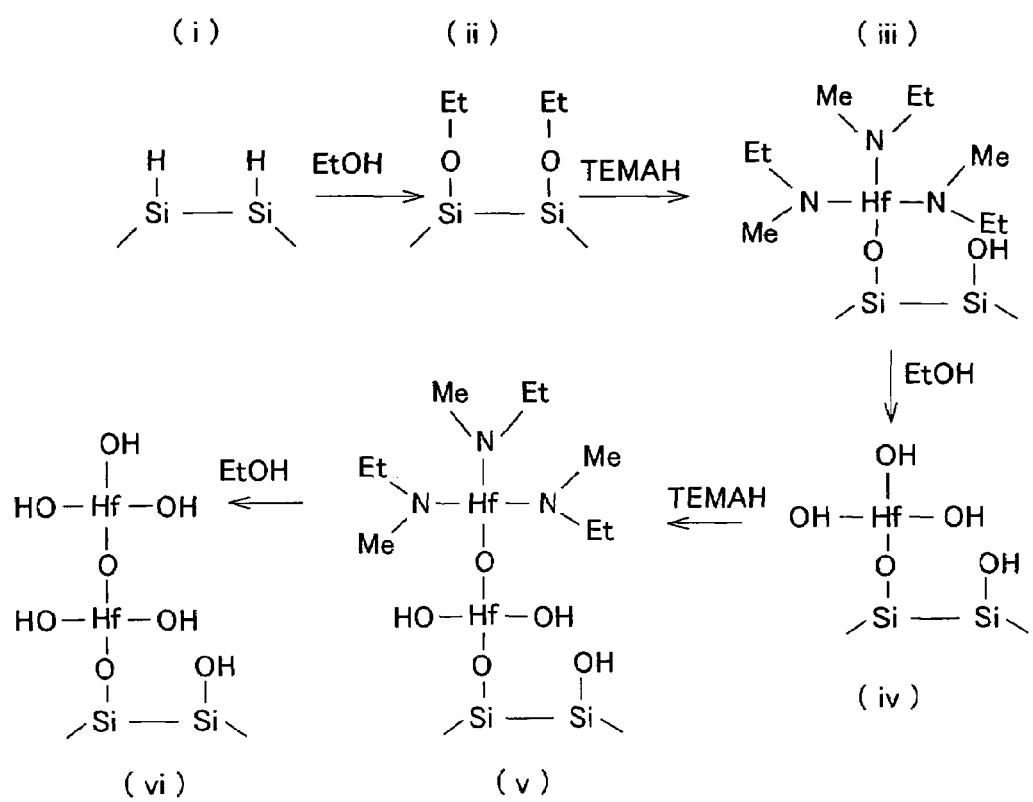
FIG. 8 is the ALD film formation mechanism in the TEMAH system and an ethanol system according to an embodiment of the present invention.

FIG. 8 shows (i) a film formation model at the time of using the TEMAH and alcohol (such as ethanol (EtOH) in the Si wafer surface terminated by hydrogen. When ethanol (EtOH) is supplied to the Si wafer surface terminated by hydrogen (H), the Si wafer surface is terminated by OH-group after H-group is substituted and OEt is attached thereto. Namely, in the first supply of EtOH, H-group on the silicon wafer surface terminated by H is substituted with OH-group. Note that in this figure, the step of terminating by OH-group is omitted. (iii) In the TEMAH supply step of a first cycle, TEAMH is adsorbed on an Si—OH site. (iv) In the ethanol (EtOH) supply step of the first cycle, desorption of N(Me)(Et) and OH termination are performed. Namely, in the second step and thereafter of supplying EtOH, a reaction site of the N(Me)(Et), being the raw material, is substituted with OH-group. (v) In the TEMAH supply step of a second cycle, TEAMH is adsorbed on an Hf—OH site. (vi) When the EtOH of the second cycle is supplied, desorption of adsorbed N(Me)(Et) of a TEMAH molecule occurs, and the reaction site of the raw material is substituted with OH-group. Thus, an $HfO_2$ film of a second atomic layer is formed.

In this way, since the alcohol having a larger polarity is used as the oxidization material, facilitation of the reaction with the thin film material can be improved. Also, since a steam pressure is larger than that of a conventionally used $H_2O$, the alcohol is not remained in the processing chamber, thus not inhibiting a controllability of a film formation process. Also, there is no case of increasing an impurity (C) amount in the film, because N(Me)(Et) of the TEMAH molecule is separated from each other, as is seen in a case of $O_3$. Further, there is no case of increasing a leak current, because $H_2O$ is remained in the film.

Also, particularly, as is shown in the example of the figure, at the time of a first gas supply, a part of H is desorped from the Si wafer by heating the Si surface terminated by H at a temperature of 350° C. or more when the EtOH is flown prior to the TEMAH. Therefore, the Si surface is terminated by OH ((FIG. 8 (ii)). Accordingly, an adsorption reaction of the TEMAH molecule is progressed in the next step (FIG. 8 (iii)), thus making it possible to further improve the facilitation of the reaction with the thin film raw material.

<Reason for Improving the Desorption of the Adsorbed N(Me)(Et) when the Polarity of the Oxide Material is Larger>

Here, in many cases, molecules have bonding of both cases such as covalently-bonding and ion-bonding. A force of attracting an electron by an atom is shown by a numerical value, and this numerical value is called electronegativity. The covalently-bonding in the molecules is charged to + or − when a difference between the electronegativity of bonding two atoms is larger, to allow polarization. The molecule having large polarity has a dipole moment. For example, although methanol (MeOH) and ethanol (EtOH) are materials having large polarities, octane and hexane are materials having small polarity. Generally, large/small of the polarity is expressed by:

Methanol>ethanol>acetone>ether>hexane>benzene, in this order.

As the dipole moment of each material, methanol is 1.7 and hexane is 0. Out of them, it is methanol and ethanol that is used as the oxide material, and in order to desorp the adsorbed N(Me)(Et) from the TEMAH molecule, such materials having larger polarities are preferable. The N(Me)(Et) are desorped by a nucleophiic substitution reaction from the TEMAH molecule and is substituted with Hf—OH.

Note that other than methanol and ethanol, alcohol having carbon atoms of 1 to 8 may be used. The alcohol having carbon atoms of 1 to 8 includes propanol, butanol, isopropyl-alcohol, etc, for example.

<OTHER ASPECT OF THE INVENTION>

According to other aspect of the present invention, there is provided a substrate processing apparatus, including:

a processing chamber that processes an Si wafer having a surface terminated by H;

a transfer unit that loads/unloads the Si wafer to/from the processing chamber;

a first gas supply line that supplies alcohol into the processing chamber as a first gas;

a second gas supply line that supplies a source gas into the processing chamber as a second gas;

an exhaust line that exhausts an inside of the processing chamber;

a controller that controls so as to generate a desired thin film on the Si wafer, by setting as one cycle supplying alcohol into the processing chamber as the first gas, first purging to discharge the first gas from the processing chamber, supplying a raw material to supply a source gas into the processing chamber as the second gas, and second purging to discharge the second gas from the processing chamber, and repeating at least this cycle a prescribed number of times.

<Further Other Aspect of the Invention>

In addition, according to further other aspect of the present invention, there is provided a method for forming a thin film, including:

loading into a processing chamber an Si wafer having a surface terminated by H;

supplying alcohol into the processing chamber as a first gas;

first purging to discharge the first gas from the processing chamber;

supplying a raw material to supply a source gas into the processing chamber as a second gas;

second purging to discharge the second gas from the processing chamber;

generating a desired thin film on the Si wafer by setting as one cycle at least the aforementioned supplying alcohol, first purging, supplying the raw material, and second purging, and repeating this cycle prescribed number of times; and unloading from the processing chamber the Si wafer on which the desired thin film is generated.

<Structure of a Semiconductor Manufacturing Apparatus for Executing the Method for Manufacturing a Semiconductor Device of an Embodiment>

Figure 9:
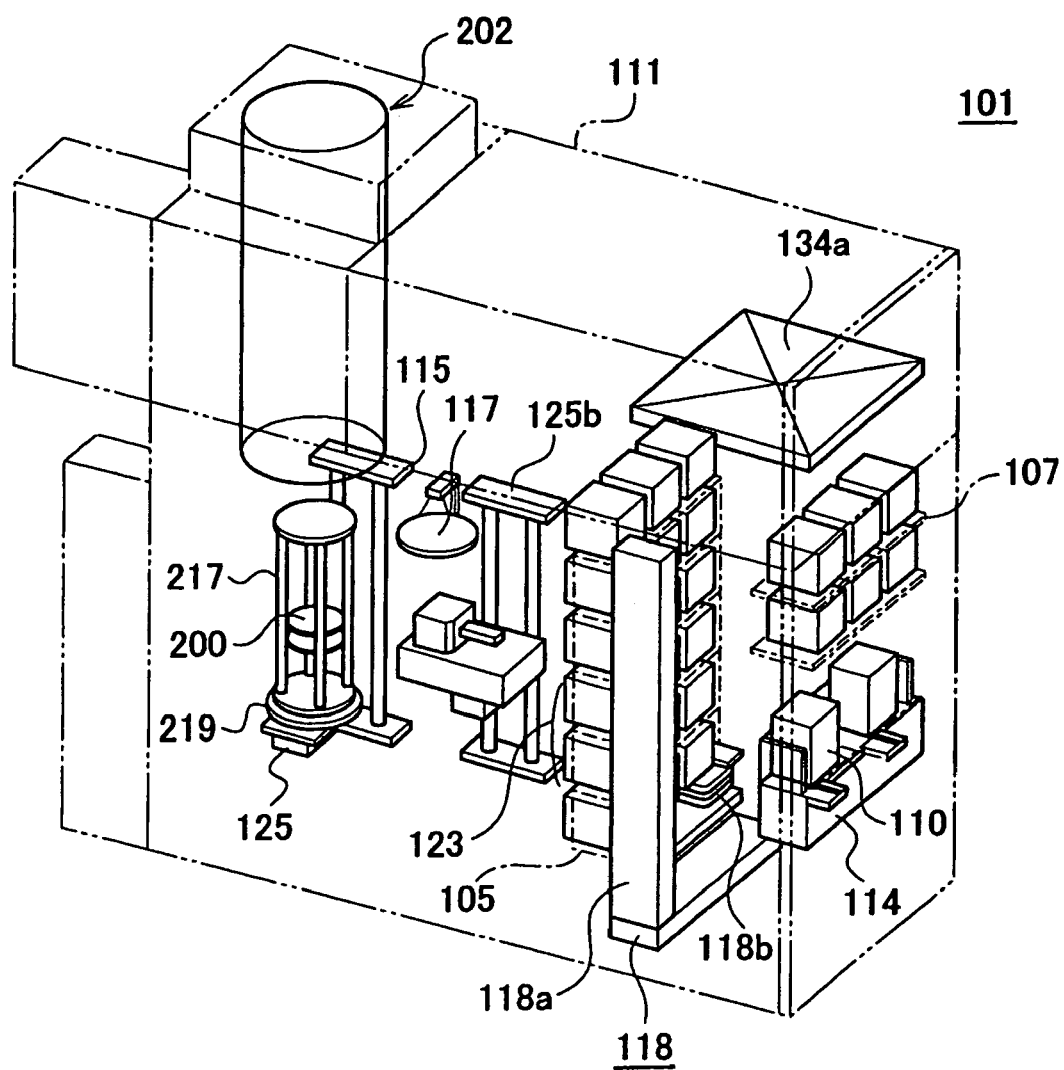
FIG. 9 is a perspective view of an $HfO_2$ film forming apparatus by ALD according to an embodiment of the present invention.

First, by using FIG. 9 and FIG. 10, explanation will be given to a semiconductor manufacturing apparatus (simply called a processing apparatus hereunder) used in a substrate processing system in which a processing step in a method for manufacturing the semiconductor device is executed. FIG. 9 shows a perspective view of the processing apparatus used in the present invention, and FIG. 10 is a side perspective view of the processing apparatus shown in FIG. 9.

Figure 10:
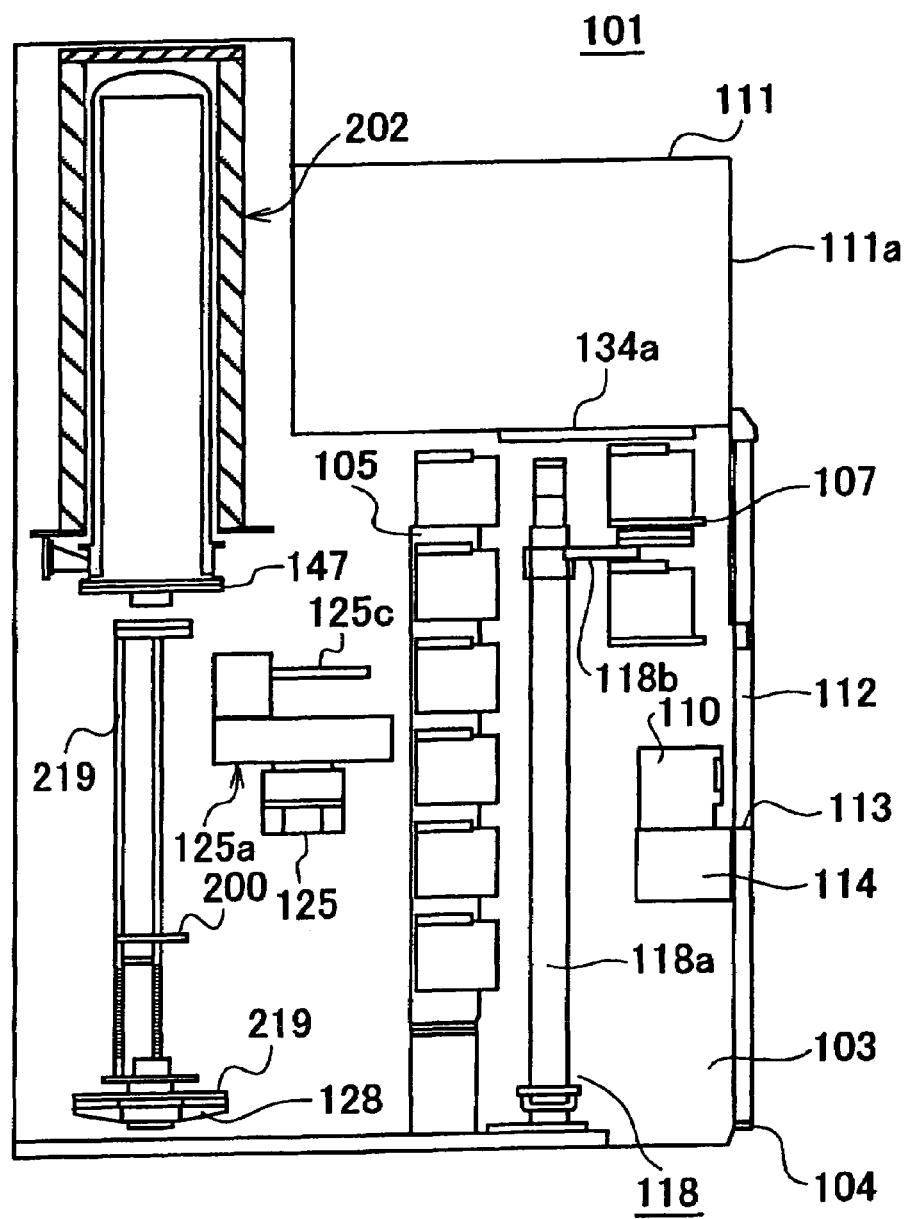
FIG. 10 is a vertical sectional view of the $HfO_2$ film forming apparatus by ALD according to an embodiment of the present invention.

As shown in FIG. 9 and FIG. 10, in a processing apparatus 101 of the present invention, a cassette 110 is used as a wafer carrier storing a wafer (substrate) 200 composed of silicon, etc., and this processing apparatus 101 includes a casing 111. A front face maintenance opening 103 is opened in a lower part of a front face wall 111a of the casing 111, as an opening part provided to allow maintenance to be performed, and a front face maintenance door 104 is built for opening/closing this front face maintenance opening 103. A cassette loading/unloading opening (substrate container loading/unloading opening) 112 is opened in the front face maintenance door 104, so as to be communicated with an inside and an outside of the casing 111, and the cassette loading/unloading opening 112 is opened/closed by a front shutter (substrate container loading/unloading opening/closing mechanism) 113.

A cassette stage (substrate container transfer table) 114 is installed inside of the casing 111 of the cassette loading/unloading opening 112. The cassette 110 is loaded on the cassette stage 114 by an in-step transfer apparatus (not shown), and is unloaded from the cassette stage 114.

The cassette stage 114 is placed by the in-step transfer apparatus so that the wafer 200 in the cassette 110 is set in a vertical posture and a wafer charging/discharging opening of the cassette 110 is faced an upper direction. The cassette stage 114 can be operated, so that the cassette 110 is vertically rotated at 90° clockwise to the rearward of the casing, the wafer 200 in the cassette 110 is set in a horizontal posture, and the wafer charging/discharging opening of the cassette 110 is faced rearward of the casing.

A cassette shelf (substrate container placement shelf) 105 is installed in approximately a central part in a lateral direction of the casing 111, and the cassette shelf 105 stores a plurality of cassettes 110 in multiple stages and in multiple rows. A placement shelf 123, on which the cassette 110 is stored, is provided on the cassette shelf 105, the cassette 110 being an object to be transferred in a wafer transfer mechanism 125. Also, a cassette shelf 107 is provided in an upper part of the cassette stage 114, so that the cassette 110 can be stored in reserve.

A cassette transfer device (substrate container transfer device) 118 is installed between the cassette stage 114 and the cassette shelf 105. The cassette transfer device 118 is constituted of a cassette elevator (substrate container elevating mechanism) 118a capable of elevating the cassette 110 in a state of holding the cassette 110, and a cassette transfer mechanism (substrate container transfer mechanism) as a transfer mechanism, so as to transfer the cassette 110 among the cassette stage 114, the cassette shelf 105, and the preliminary cassette shelf 107, by a continuous operation of the cassette elevator 118a and the cassette transfer mechanism 118b.

The wafer transfer mechanism (substrate transfer mechanism) 125 is installed in a backside of the cassette shelf 105, and is constituted of a wafer transfer device (substrate transfer device) 125a capable of horizontally rotating or straightly moving the wafer 200, and a wafer transfer device elevator (substrate transfer device elevating mechanism) 125b for elevating the wafer transfer device 125a. The wafer transfer device elevator 125b is installed at a right side end portion of the casing 111 of withstand pressure. By the continuous operation of the wafer transfer device elevator 125b and the wafer transfer device 125a, the wafer 200 is charged and discharged into/from a boat (substrate holding tool) 217, with a tweezer (substrate holding body) 125c of the wafer transfer device 125a as a placement part of the wafer 200.

As shown in FIG. 10, a processing furnace 202 is provided in a rear upper part of the casing 111. A lower end part of the processing furnace 202 is opened/closed by a furnace throat shutter (furnace throat opening/closing mechanism) 147.

A boat elevator (substrate holding tool elevating mechanism) 115 is provided in a lower part of the processing furnace 202, as an elevating mechanism to elevate the boat 217 in the processing furnace 202, and a seal cap 219 as a lid body is horizontally installed in an arm 128 as a connecting tool connected to an elevating table of the boat elevator 115, so that the seal cap 219 vertically supports the boat 217 to close the lower end portion of the processing furnace 202.

A plurality of holding members are provided in the boat 217, so as to horizontally hold a plurality of wafers 200 (about 50 to 150 wafers) in a state of being vertically arranged, with their centers aligned.

As shown in FIG. 9, a clean unit 134a constituted of a supply fan and a dust-prevention filter for supplying clean air, being a cleaned atmosphere, is provided in an upper part of the cassette shelf 105, so that the clean air is flown into the casing 111.

Also, as schematically shown in FIG. 9, the clean unit (not shown) constituted of the supply fan and the dust-prevention filter for supplying clean air is installed in a left side end portion of the casing 111, which is the opposite side to the wafer transfer device elevator 125b and the boat elevator 115 side, so that the clean air blown from the clean unit not shown is flown to the wafer transfer device 125a and the boat 217, then, sucked in an exhaust device not shown, and is exhausted to an outside of the casing 111.

<Operation of the Processing Apparatus>

An operation of the processing apparatus of the present invention will be explained next.

As shown in FIG. 9 and FIG. 10, prior to supplying the cassette 110 to the cassette stage 114, the cassette loading/unloading opening 112 is opened by a front shutter 113. Thereafter, the cassette 110 is loaded from the cassette lading/unloading opening 112, and the wafer 200 is placed on the cassette stage 114 in a vertical posture, so that the wafer charging/discharging opening of the cassette 110 is faced upward. Thereafter, the cassette 110 is vertically rotated by the cassette stage 114 at 90° clockwise to the rearward of the casing by the cassette stage 114, so that the wafer 200 in the cassette 110 is set in a horizontal posture and the wafer charging/discharging opening of the cassette 110 is faced to the rearward of the casing.

Next, the cassette 110 is automatically transferred to a designated shelf position of the cassette shelf 105 or the preliminary cassette shelf 107 by the cassette transfer device 118, is temporarily stored therein, and is transferred to the placement shelf 123 from the cassette shelf 105 or the preliminary cassette shelf 107 by the cassette transfer device 118, or is directly transferred to the placement shelf 123.

When the cassette 110 is transferred to the placement shelf 123, the wafer 200 is picked up from the cassette 110 through the wafer charging/discharging opening by the tweezer 125c of the wafer transfer device 125a, and is charged into the boat 217 at the backside of a transfer chamber 124. The wafer transfer device 125a, which transfers the wafer 200 to the boat 217, is returned to the cassette 110 and charges the next wafer 200 into the boat 217.

When the previously designated number of wafers 200 are charged into the boat 217, the lower end portion of the processing furnace 202 closed by the furnace throat shutter 147 is opened by a furnace throat shutter 147. Subsequently, the boat 217 holding a wafer 200 group is loaded into the processing furnace 202 by elevating the seal cap 219 by the boat elevator 115. After loading, an arbitrary processing is applied to the wafer 200 in the processing furnace 202. After processing, the wafer 200 and the cassette 110 are discharged to outside of the casing 111 in a reversed procedure to the aforementioned procedure.

<Structure of the Processing Furnace>

Next, by using FIG. 11, explanation will be given to a processing furnace 202 applied to the aforementioned substrate processing apparatus.

Figure 11A:
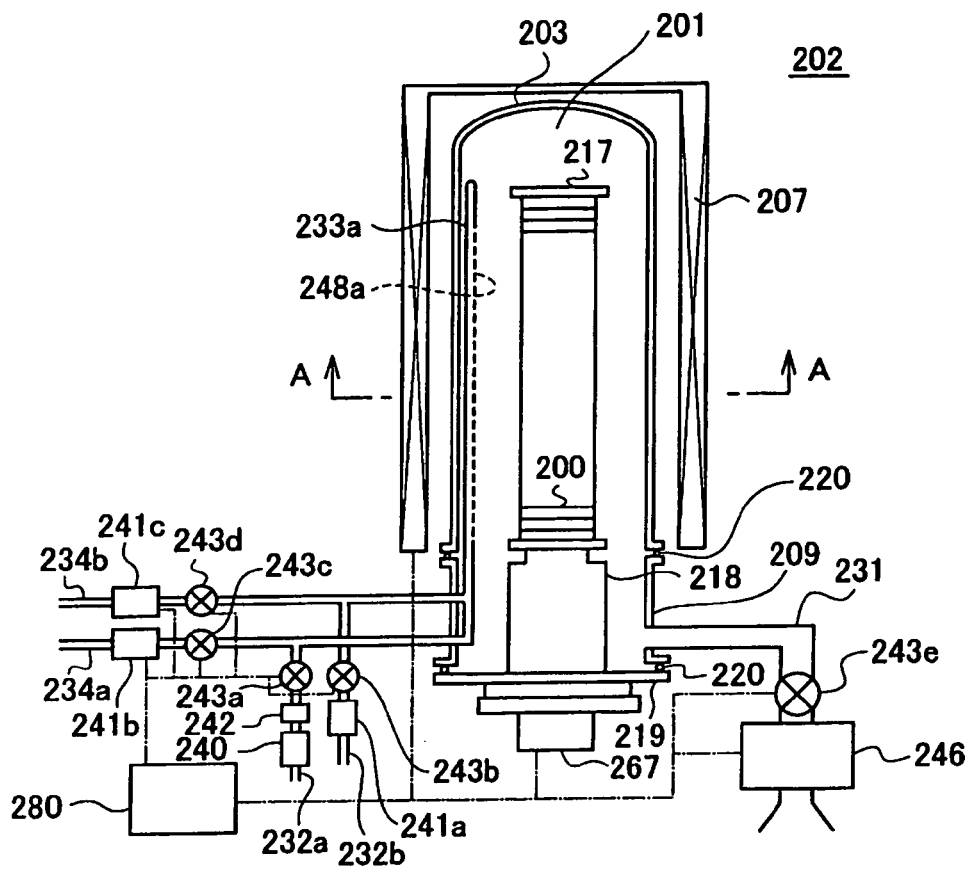
FIG. 11A is a vertical sectional view of the processing furnace and FIG. 11B is a sectional view taken along the A-A line shown by arrow.
Figure 11B:
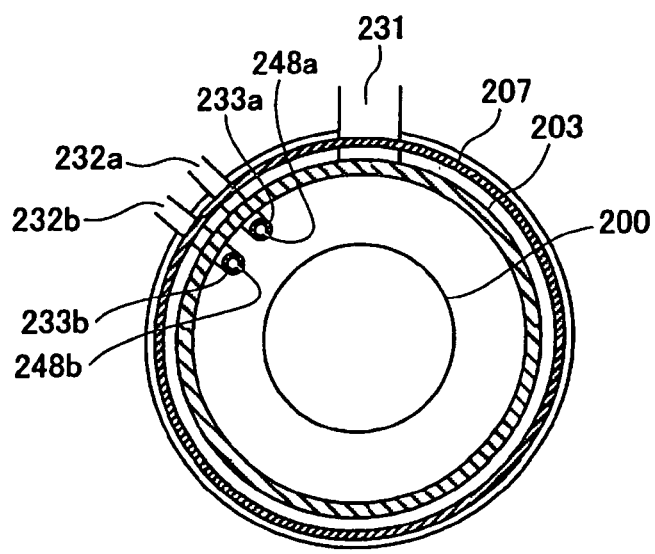

FIG. 11 is an outline block diagram of a vertical substrate processing furnace suitably used in this embodiment, wherein a processing furnace 202 part is shown by a vertical sectional face and a processing furnace 202 part is shown by a vertical sectional face taken along the A-A line of FIG. 11.

A reaction tube 203 is provided as a reaction vessel inside of a heater 207, being a heating device (heating means), for processing the wafer 200, being the substrate. Then, a manifold 209 made of stainless, etc, is provided on a lower end of this reaction tube 203, and a lower end opening of the manifold 209 is provided via an O-ring 220, being a sealing member, and this lower end opening is air-tightly closed by a seal cap 219 via the o-ring 220, and a processing chamber 201 is formed by at least the reaction tube 203, the manifold 209, and the seal cap 219. A boat 217, being a substrate holding member (substrate holding means) is erected on the seal cap 219 via a boat support base 218, thus making the boat support base 218 as a holding body for holding the boat. Then, the boat 217 is inserted into the processing chamber 201. A plurality of batch-treated wafers 200 are piled on the boat 217 in horizontal postures, in a tube axial direction, and in multiple stages. The heater 207 heats the wafer 200 inserted into the processing chamber 201 up to a prescribed temperature.

Two gas supply tubes (a first gas supply tube 232a and a second gas supply tube 232b) are provided, as supply routes for supplying a plurality of kinds of processing gases, such as two kinds of processing gases here, to the processing chamber 201. A liquid mass flow controller 240, being a flow rate control device (flow rate controller), a vaporizer 242, and a first carrier gas supply tube 234a for supplying a carrier gas via a first valve 243a, being an opening/closing valve, are jointed with a first gas supply tube 232a, sequentially from an upper stream direction. In this first carrier gas supply tube 234a, a second mass flow controller 241b, being the flow rate control device (flow rate controller) and a third valve 243c, being the opening/closing valve are provided sequentially from an upper stream direction. Also, at a tip end portion of the first gas supply tube 232a, a first nozzle 233a is provided on an inner wall from a lower part to an upper part of the reaction tube 203 along a piling direction of the wafers 200, in an arcuate space between the inner wall of the reaction tube 203 and the wafer 200, which constitute the processing chamber 201, and a first gas supply hole 248a, being a supply hole for supplying gas is provided on a side face of the first nozzle 233a.

This first gas supply hole 248a has the same opening area from the lower part to the upper part, and further this first gas supply hole 248a is provided at the same opening pitch.

A first mass flow controller 241a, being the flow rate control device (flow rate controller), and a second carrier gas supply tube 234b for supplying the carrier gas are flown together with a second gas supply tube 232b sequentially from the upper stream direction, via a second valve 243b, being the opening/closing valve. In this second carrier gas supply tube 234b, a third mass flow controller 241c, being the flow rate control device (flow rate controller) and a fourth valve 243, being the opening/closing valve, are provided sequentially from the upper stream direction. In addition, at the tip end portion of the second gas supply tube 232b, a second nozzle 233b is provided on the inner wall from the lower part to the upper part of the reaction tube 203 along the piling direction of the wafers 200, and a second gas supply hole 248b, being the supply hole for supplying the gas is provided on the side face of the second nozzle 233b. This second gas supply hole 248b has the same opening area from the lower part to the upper part, and further this second gas supply hole 248b is provided at the same opening pitch.

For example, when the raw material supplied from the first gas supply tube 232a is a liquid, the reaction gas is supplied into the processing chamber 201, from the first gas supply tube 232a, via the liquid mass flow controller 240, the vaporizer 242, and the first valve 243a, and the reaction gas is further jointed with the gas from the first carrier gas supply tube 234 via the first nozzle 233a. For example, when the raw material supplied from the first gas supply tube 232a is a gas, a liquid mass flow controller 240 is replaced with the mass flow controller for gas, thus eliminating the vaporizer 242. Also, the reaction gas is jointed with the second carrier gas supply tube 234b via the first mass flow controller 241a, the second valve 243b, and is further jointed with the gas from the second carrier gas supply tube 234b via the second nozzle 233b, and further is supplied into the processing chamber 201 via the second nozzle 233b.

In addition, the processing chamber 201 is connected to a vacuum pump 246, being an exhaust device (exhaust unit) by a gas exhaust tube 231, being an exhaust tube for exhausting gas, via a fifth valve 243e, so as to be vacuum-exhausted. Note that this fifth valve 243e opens/closes the valve to perform vacuum-exhaust and stop of vacuum-exhaust, and further adjusts a valve opening degree, so that a pressure can be adjusted.

The boat 217, in which a plurality of wafers 200 are placed in multiple stages at the same intervals, is provided in a central part in the reaction tube 203, so that this boat 217 can be charged and discharged into/from the reaction tube 203 by a boat elevating mechanism not shown. In addition, there is provided a boat rotating mechanism 2G7 for rotating the boat 217 for improving a uniformity in processing, and by driving the boat rotating mechanism 267, the boat 217 supported by the boat support base 218 is rotated.

A controller 280, being a controller (control unit), is connected to a liquid mass flow controller 240, first to third mass flow controllers 241a, 241b, 241c, first to fifth valves 243a, 243b, 243c, 243d, 243e, a heater 207, a vacuum pump 246, a boat rotating mechanism 267, and a boat elevating mechanism not shown, and a flow rate adjustment of the liquid mass flow controller 240, and the first to third mass flow controllers 241a, 241b, 241c, an opening/closing operation of the first to fourth valves 243a, 243b, 243c, 243, opening/closing and a pressure adjustment operation of the fifth valve 243e, a temperature adjustment of the heater 207, start/stop of the vacuum pump 246, a rotation speed adjustment of the boat rotating mechanism 267, and an elevating operation control of the boat elevating mechanism are performed.

In addition, in the processing furnace 202 of the present invention, a high-dielectric film such as $HfO_2$ and $ZrO_2$ are formed. Materials thereof include amino-based raw materials such as TEMAH (tetrax methyl ethyl amino hafnium; Hf(NEtMe)$_4$), TDMAH(tetrax dimethyl amino hafnium; Hf(NMr$_2$)$_4$), TDEAH(tetrax diethyl amino hafnium; Hf(NMe$_2$)$_4$), and Hf(O-tBu)$_4$, Hf(MMP)$_4$, etc. As a $ZrO_2$ material, as well as a Hf material, Zr(NEtMe)$_4$, Zr(NMe$_2$)$_4$, Zr(NEt$_2$)$_4$, Zr(MMP)$_4$, Zr(O-tBu)$_4$, etc, are used. Note that Zr(O-tBu)$_4$, indicates Zr(OC(CH$_3$)$_3$, and Zr(MMP)$_4$ indicates Zr(OC(CH$_3$)$_2$CH$_2$OCH$_3$)$_4$, respectively. Also, the amino-based raw materials are used in many cases as organic compounds for the raw material other than Hf and Zr.

In addition, in other formation of the dielectric film, for example, in the formation of $SiO_2$, the raw material of tridimethyl amino silicon (SiH(NHe$_2$)$_3$) is used.

EXAMPLE 1

Film Formation Example of an $HfO_2$ Film of an Example 1

Explanation will be given hereunder to a film formation processing example using an ALD method, based on an example of forming an $HfO_2$ film using TEMAH and alcohol, being one of the manufacturing steps of the semiconductor device.

As described above, the ALD method is a technique of alternately supplying the reactive gas, being at least two kinds of raw materials used in film formation, onto the Si wafer one by one, making it adsorbed on the Si wafer by 1 atomic unit, and performing film formation using a surface reaction. At this time, control of the film thickness is performed by the number of cycles for supplying the reactive gas (for example, 20 cycles when the film of 20 Å is formed, with a film formation speed set at 1 Å/cycle).

In this ALD method, for example, in case of forming an $HfO_2$ film, a high quality film formation is possible at a low temperature of 180 to 300° C. by using TEMAH and ethanol.

Figure 1:
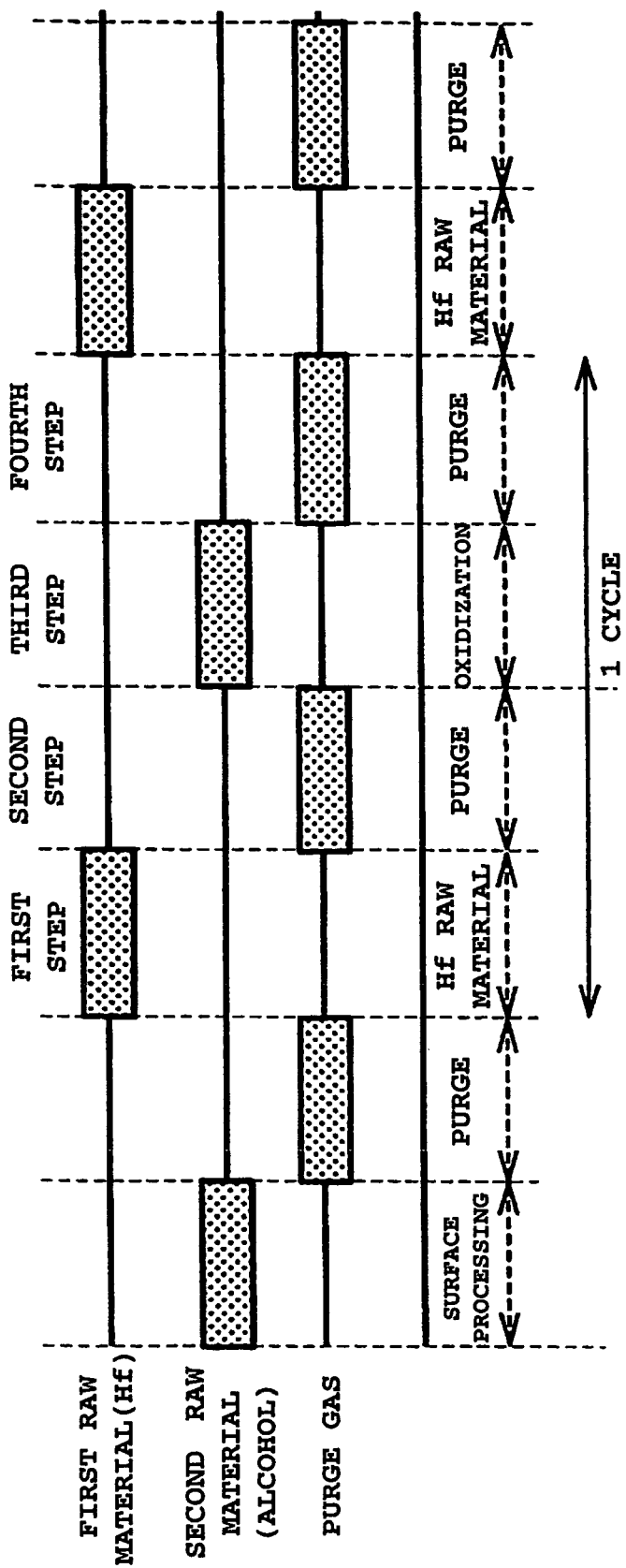
FIG. 1 is an $HfO_2$ film formation process sequence by ALD according to an example 1 of the present invention.

FIG. 1 shows a process sequence of an $HfO_2$ film formation by ALD in an example 1.

In this example 1, surface processing is performed by alcohol, for example, ethanol, which is a solvent having a large polarity, being the second gas. This is because the Si wafer surface is turned into OH. Here, the Si wafer surface terminated by H is provided for the following reason. Although it can be so considered that the Si wafer surface is preferably turned into OH just after cleaning, in order to prevent an adhesion of moisture or organic matters in an atmospheric air, preferably the Si wafer surface is terminated by inactive H, and the surface is required to be turned into OH after being introduced into the processing chamber.

The processing chamber is purged by an inactive gas after surface processing, and a residual alcohol in the processing chamber is discharged outside the processing chamber. Four steps are included in one cycle repeated after purging, and in a first step, first, Hf source gas as a first raw material is flown into the processing chamber, to make this raw material adsorbed on the Si wafer surface (Hf raw material supplying step). In a second step, the processing chamber is purged by the inactive gas, to discharge the residual Hf source gas in the processing chamber (first purging step). In a third step, alcohol as a second raw material is flown, to form $HfO_2$ by a reaction of the Hf source gas adsorbed on the Si wafer surface and alcohol (alcohol supplying step). The alcohol used here may be the same one used in the surface processing. In a fourth step, an inside of the processing chamber is purged by the inactive gas, and the residual alcohol in the processing chamber is discharged to the outside the processing chamber (second purging step).

As an example of each step time, 1 to 30 seconds are required for the first step (Hf raw material supplying step), 5 to 15 seconds are required for the second step (purging step), 5 to 60 seconds are required for the third step (alcohol supplying step), and 3 seconds are required for the fourth step (purging step).

In addition, as the inactive gas used as a purge gas in the first purging step and the second purging step, any one of helium (He), neon (Ne), algon (Ar), nitrogen ($N_2$) may be used. Further, a pressure in the processing chamber may be set at 1 Pa to 10,000 Pa.

Next, the explanation will be specifically given. First, as described above, the wafer 200 is charged into the boat 217 and is loaded into the processing chamber 201. After the boat 217 is loaded into the processing chamber 201, six steps as will be described later are sequentially executed.

(Step 1: Supply of Alcohol)

Pre-processing is applied to the surface of the wafer 200 by using the second gas, before supplying the first gas into the processing chamber. Ethanol is flown to the second gas supply tube 232b and a carrier gas ($N_2$) is flown to the second carrier gas supply tube 234b. The second valve 243b of the second gas supply tube 232b and the fourth valve 243 of the second carrier gas supply tube 234b are simultaneously opened. The carrier gas is flown from the second carrier gas supply tube 234b, so that the flow rate is adjusted by the third mass flow controller 241c. Ethanol is flown from the second gas supply tube 232b, with the flow rate adjusted by the third mass flow controller and flow adjusted carrier gas mixed therein, and is exhausted from the gas exhaust tube 231 while being supplied into the processing chamber 201 from the second gas supply hole 248b of the second nozzle 233b. At this time, by properly adjusting the fifth valve 243e, the pressure in the processing chamber 201 is maintained (Step 2: Alcohol Purge)

The first valve 243a of the first gas supply tube 232a is closed, and the supply of ethanol is stopped. At this time, the fifth valve 243e of the gas exhaust tube 231 is remained opened, and the inside of the processing chamber 201 is exhausted down to 20 Pa or less by the vacuum pump 246, and residual ethanol gas is removed from the inside of the processing chamber 201.

(Step 3: Supply of Hf Raw Material)

TEMAH is flown to the first carrier gas supply tube 232a, and carrier gas ($N_2$) is flown to the first carrier gas supply tube 234a. At this time, the fifth valve 243e of the gas exhaust tube 231 is opened. All of the first valve 243a of the first gas supply tube 232a and the third valve 243c of the first carrier gas supply tube 234a are opened. The carrier gas is flown from the first carrier gas supply tube 234a, and the flow rate is adjusted by the second mass flow controller 241b. TEMAH is flown from the first gas supply tube 232a, with the flow rate adjusted by the liquid mass flow controller, and is evaporated by the vaporizer 242, with flow adjusted carrier gas mixed therein, and is exhausted from the gas exhaust tube 231 while being supplied into the processing chamber 201 from the first gas supply hole 248a. At this time, the pressure in the processing chamber 201 is set in a range from 6.6 to 665 Pa, such as 300 Pa, by properly adjusting the fifth valve 243e. A supply amount of the TEMAH controlled by the liquid mass flow controller 240 is set at 0.01 to 0.5 g/min. Time required for exposing the wafer 200 to the TEMAH gas is 30 to 180 seconds. At this time, the temperature of the heater 207 is set, so that the temperature of the wafer is in a range from 180 to 300° C., such as 200° C.

By supplying the TEMAH into the processing chamber, surface reaction (chemical adsorption) with a surface part such as an under layer film on the wafer 200 occurs.

(Step 4: Hf Source Gas Purge)

The first valve 243a of the first gas supply tube 232a is closed, and the supply of the TEMACH is stopped. At this time, the fifth valve 243e of the gas exhaust tube 231 is remained opened, and the inside of the processing chamber 201 is exhausted so that the pressure inside the processing chamber 201 is exhausted down to 20 Pa or less by the vacuum pump 246, and residual TEMAH gas is removed from the inside of the processing chamber 201. At this time, when the inactive gas such as $N_2$ is supplied into the processing chamber 201, an advantage of removing the residual TEMAH gas is further improved.

(Step 5: Oxidization (Supply of Alcohol))

The alcohol is flown to the second gas supply tube 232b, and the carrier gas ($N_2$) is flown to the second carrier gas supply tube 234b. Both of the second valve 243b of the second gas supply tube 232b and the fourth valve 243 of the second carrier gas supply tube 234b are opened. The carrier gas is flown from the second carrier gas supply tube 234b, and the flow rate is adjusted by the third mass flow controller 241c. The alcohol is flown from the second gas supply tube 232b, with the flow rate adjusted by the third mass flow controller and the flow-adjusted carrier gas mixed therein, and is exhausted from the gas exhaust tube 231 while being supplied into the processing chamber 201 from the second gas supply hole 248b of the second nozzle 233b. At this time, the pressure in the processing chamber 201 is maintained in a range from 26 to 266 Pa, such as 66 Pa, by properly adjusting the fifth valve 243e. Time required for exposing the wafer 200 to EtOH is 10 to 120 seconds. The heater 207 is set, so that the temperature of the wafer at this time is in a range from 180 to 300° C., such as 200° C., in the same way as the step 1 of supplying the TEMAH gas. By the supply of the EtOH, the surface reaction occurs between the TEMAH and EtOH chemically adsorbed on the surface of the wafer 200, thereby forming the $HfO_2$ film on the wafer 200.

(Step 6: Alcohol Purge)

The first valve 243a of the first gas supply tube 232a is closed, and the supply of the ethanol is stopped. At this time, the fifth valve 243e of the gas exhaust tube 231 is remained opened, and the inside of the processing chamber 201 is exhausted down to 20 Pa of less by the vacuum pump 246, and the residual ethanol gas is removed from the inside of the processing chamber 201.

According to the aforementioned example 1, the alcohol having a large polarity is used as the oxide material. Therefore, without increasing the supply amount of the Hf source gas, the reaction with the Hf raw material can be easily progressed. In addition, the OH-group is dissociated from the alcohol in the alcohol process, and therefore no step for generating the OH-group is required. Accordingly, ease of reaction is improved, thus making it possible to prevent a deterioration of the throughput. In addition, there is no need of increasing the supply amount of the Hf raw material or increasing the supply time, thus making it possible to prevent the increase of cost. Further, even if the pattern wafer having a trench structure is used, the problem such as decreasing the film thickness in the central part of the wafer is solved, thus making it possible to improve the step coverage. In addition, a loading effect is also improved, such as deteriorating the step coverage of the $HfO_2$ film by the number of loaded pattern wafers in 1 batch. Further, since alcohol desorps N(Me)(Et), there is no case that $H_2O$ remains in the film to increase the leak current, with less taken-in of carbon (C) during film formation. This makes it possible to obtain the $HfO_2$ film capable of making the hafnium raw material, being a metal compound raw material, on the surface of the wafer (step), with good surface planarity at a low temperature, and also capable of having an excellent step coverage (recess embedding property) in a short time at a low cost, in the ALD film formation by the metal compound raw material and the alcohol.

<Film Formation Example of the $HfO_2$ Film of Comparative Example 1>

Figure 2:
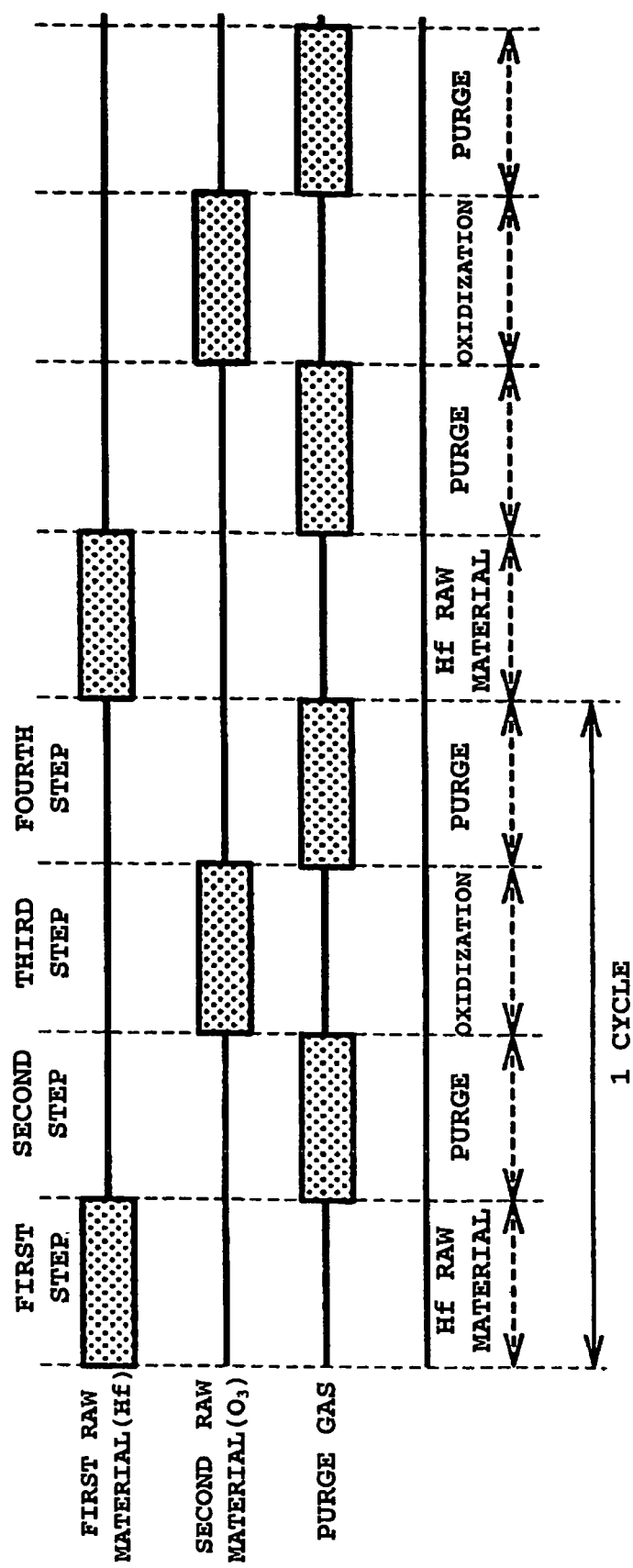
FIG. 2 is the $HfO_2$ film formation process sequence by ALD according to a comparative example 1.

FIG. 2 shows the process sequence of the $HfO_2$ film formation by ALD according to a comparative example 1. The comparative example 1 is different from the example 1 in the point that the process sequence is executed without applying surface processing, oxidization is progressed by flowing $O_3$ as the oxide material in the third step and residual $O_3$ is purged in the fourth step, and the first and second steps of the process sequence are the same as an ALD oxide film forming step of the example 1.

The comparative example 1 shows the process of $O_3$, and therefore the step of generating the OH-group by the reaction of active O* and N(Me)(Et) is required. Therefore, when the surface of the Si wafer is turned into OH, the reaction is not easily progressed, compared to the oxidization of the example 1 by using alcohol. In addition, in the comparative example 1, the N(Me (Et) is separated by the active O*, and therefore taking-in of carbon (C) during film formation is increased.

EXAMPLE 2

Here, explanation is given to an example of forming the $HfO_2$ film by using $HfCl_4$ and alcohol.

Film Formation Example of the $HfO_2$ Film of an Example 2

Figure 3:
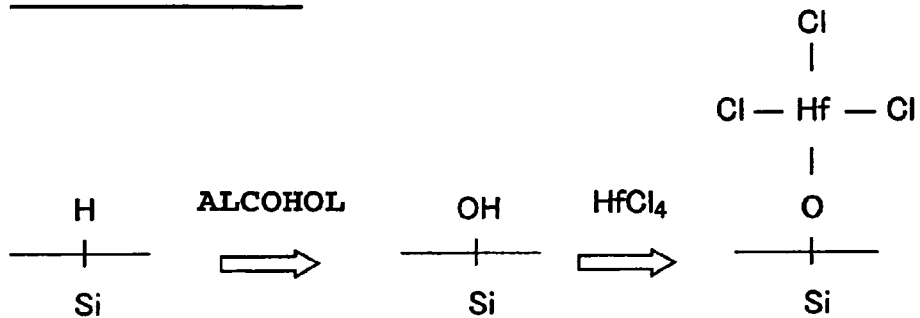
FIG. 3 is a reaction explanation view of a case of previously flowing alcohol according to an example 2 of the present invention.

As shown in FIG. 3, first, the alcohol is flown to the Si wafer having the surface terminated by H. H-group on the surface of the Si wafer terminated by H is substituted with the OH-group. Here, when the $HfCl_4$ is flown, the H-group of the OH-group is substituted with $HfCl_3$. In the second supply of the alcohol and thereafter, the Cl as a reaction site of the raw material is substituted with the OH-group.

Thus, when the alcohol is previously flown, Si—O—Hf is formed, and an interfacial oxide film O is formed on the surface of the Si wafer, thereby making it difficult to diffuse Hf in the Si wafer, and there is no possibility that the Hf raw material enters into the Si wafer.

Film Formation Example of the $HfO_2$ Film of a Comparative Example 2

A comparative example 2 is different from the example 2 in only the point that the raw material ($HfCl_4$) is previously flown when the processing gas is supplied to the processing chamber, and other steps are same.

Figure 4:
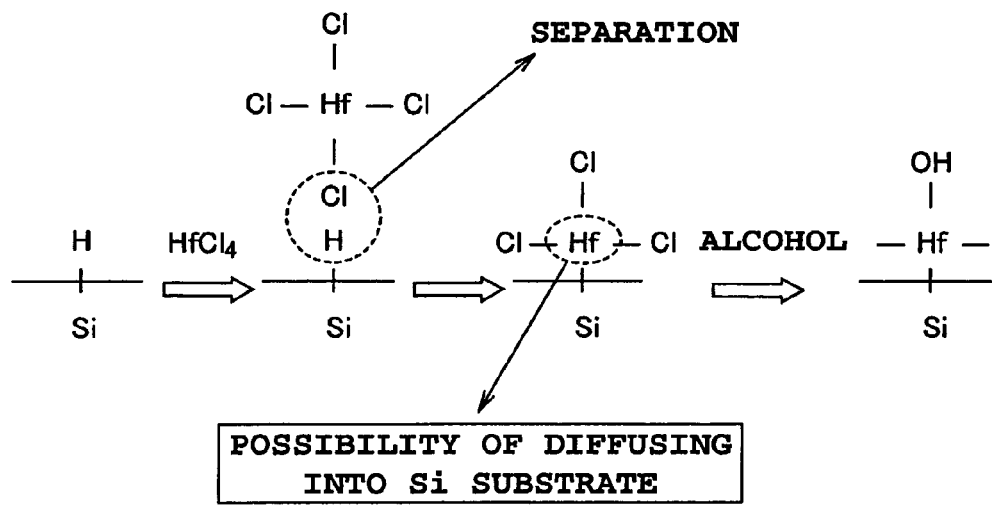
FIG. 4 is a reaction explanation view of the case of previously flowing a raw material of a comparative example 2.

As shown in FIG. 4, when the raw material ($HfCl_4$) is previously flown, Cl of the $HfCl_4$ and H of the Si—H are disorped. By this desorption, the $HfCl_3$, being the raw material, is adhered to the surface of the Si wafer. Here, when the alcohol is flown, Cl, being the reaction site of the raw material, is substituted with the OH-group.

When the raw material ($HfCl_4$) is previously flown like this comparative example 2, the Si—Hf is formed after the aforementioned desorption, and the interfacial oxide film is not formed, thus making it easy to diffuse Hf, and there is a possibility that the Hf raw material enters into the Si wafer. Although the probability of such a reaction is low, this reaction is considered to have not a little adverse influence on a film quality.

What is claimed is:

1. A method for manufacturing a semiconductor device, comprising:

loading a silicon wafer having a surface terminated by H into a processing chamber;

supplying alcohol to supply the alcohol into said processing chamber as a first gas;

first purging to discharge the first gas from an inside of said processing chamber;

supplying a raw material to supply source gas into said processing chamber as a second gas;

second purging to discharge the second gas from the inside of said processing chamber;

setting said supplying alcohol, first purging; supplying the raw material, and second purging as one cycle, and repeating this cycle a prescribed number of times, thereby generating a desired thin film on said silicon wafer; and unloading the silicon wafer, with said desired thin film generated, from the inside of said processing chamber.

2. The method for manufacturing the semiconductor device according to claim 1, wherein when said gas is supplied into said processing chamber, the alcohol, being said first gas, is supplied into said processing chamber, prior to tetrakis-methyl-ethyl-amino-hafnium (TEMAH), being said second gas.

3. The method for manufacturing the semiconductor device according to claim 2, wherein said alcohol is ethanol (EtOH).

4. The method for manufacturing the semiconductor device according to claim 2, wherein said alcohol is methanol (MeOH).

5. The method for manufacturing the semiconductor device according to claim 2, further comprising:

heating said silicon wafer in a temperature range from 180° C. to 300° C.

6. The method for manufacturing the semiconductor device according to claim 1, wherein in a first supply of the alcohol, being said first gas, supplied into said processing chamber, H-group on a surface of said silicon wafer terminated by said H is substituted with OH-group, and in a second supply of the alcohol and thereafter, a reaction site of a raw material is substituted with the OH-group.

7. A method for forming a thin film, comprising:

loading a silicon wafer having a surface terminated by H into a processing chamber;

supplying alcohol to supply the alcohol into said processing chamber as a first gas;

first purging to discharge the first gas from an inside of said processing chamber;

supplying a raw material to supply a source gas into said processing chamber as a second gas;

second purging to discharge the second gas from the inside of said processing chamber;

setting at least said supplying alcohol, said first purging, said supplying the raw material, and said second purging as one cycle, and repeating this cycle a plurality of times, thereby forming a desired thin film on said silicon wafer; and unloading the silicon wafer, with said desired thin film formed, from the inside of said processing chamber.

* * * * *